United States Patent [19]

Inoue

[11] Patent Number: 4,656,054
[45] Date of Patent: Apr. 7, 1987

[54] METHOD OF MANUFACTURING A SEMICONDUCTOR DEVICE INVOLVING A CAPACITOR

[75] Inventor: Tomoyasu Inoue, Tokyo, Japan

[73] Assignee: Kabushiki Kaisha Toshiba, Kawasaki, Japan

[21] Appl. No.: 707,809

[22] Filed: Mar. 4, 1985

[30] Foreign Application Priority Data

Aug. 16, 1984 [JP] Japan ................... 59-169971

[51] Int. Cl.$^4$ ............................................. B05D 5/12
[52] U.S. Cl. .......................................... 427/81; 427/79; 427/86; 427/87; 427/95
[58] Field of Search ............... 427/79, 81, 86, 87, 427/95

[56] References Cited

U.S. PATENT DOCUMENTS 4,200,474 4/1980 Morris .................... 427/79

FOREIGN PATENT DOCUMENTS 53-76686 7/1978 Japan .

OTHER PUBLICATIONS

Flanders, J. Vac. Sci. Technol. 19(4), Nov./Dec. 1981, pp. 892-896.

Primary Examiner—Richard Bueker
Attorney, Agent, or Firm—Oblon, Fisher, Spivak, McClelland & Maier

[57] ABSTRACT

A method is shown which manufactures a semiconductor device having a capacitor. An insulation film having at least one opening of a predetermined pattern is formed on a capacitor formation area on a semiconductor substrate. The opening reaches the surface portion of the semiconductor substrate to permit it to be exposed. A semiconductor layer is selectively grown on the bottom surface of the opening, i.e., on the exposed surface of the semiconductor substrate. Thereafter, the insulation film is removed to leave a recessed region in a capacitor formation area and a capacitor electrode is formed in the capacitor formation area with a gate insulation film therebetween.

13 Claims, 23 Drawing Figures

F I G. 9  F I G. 10
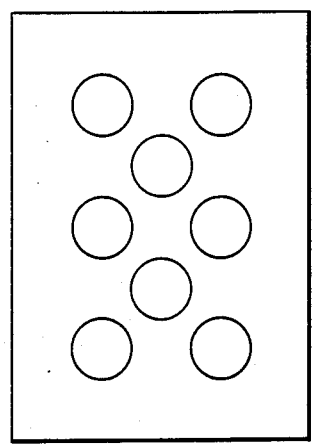
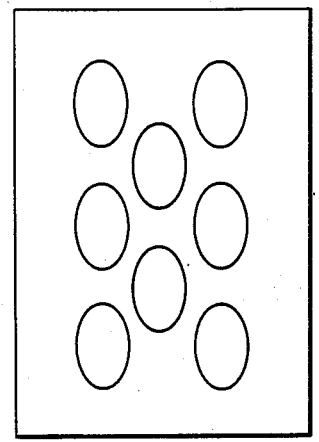
F I G. 11
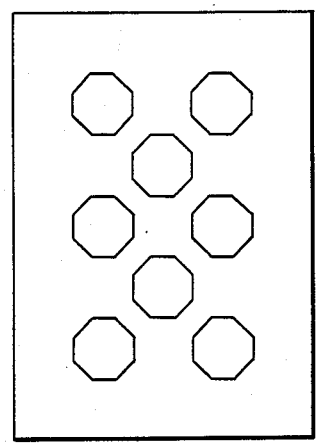

METHOD OF MANUFACTURING A SEMICONDUCTOR DEVICE INVOLVING A CAPACITOR

BACKGROUND OF THE INVENTION

1. Field of the Invention

This invention relates to a method of manufacturing a semiconductor device involving a capacitor.

2. Discussion of Background

Recently, the MOS dynamic RAM has been integrated and greatly improved. The MOS dynamic RAM is generally represented by a memory cell consisting of one MOS capacitor and one MOSFET. This dynamic RAM (dRAM) has the drawback that the MOS capacitor has a reduced capacitance due to the greater integration and contraction of a memory cell area, thus leading to a decline in the charge capacity. One process of coping with the above-mentioned difficulty is to increase the dielectric constant of the MOS capacitor insulation layer to a level greater than was possible in the past, or make said insulation layer thinner than was possible heretofore. The former process involves the substitution of the $SiO_2$ insulation layer by a type of $Si_3N_4$ or $Ta_2O_5$. However, these layers have the drawback that the trap density of carriers is high, thus resulting in an unstable voltage-capacitance characteristic. The latter process is also accompanied with the difficulties that due to the presence of a critical insulation layer thickness which undesirably causes a tunnel current to flow, the insulation layer can be thinned only to an extent of several nm units at most.

Further, a process of effectively broadening the MOS capacitor area set forth, for example, in the Japanese patent disclosure (KOKAI) No. 53-76686 comprises the step of trenching in that region of the substrate surface which constitutes a capacitor and utilizing the side walls of said trench for the above-mentioned object. However, this proposed process is still accompanied with the drawback that difficulties are encountered in forming a deep, fine trench; it is difficult to control the form of said trench; it is also difficult to trench with high reproducibility; and noticeable variations arise in the capacitance.

SUMMARY OF THE INVENTION

It is accordingly the object of this invention to provide a method of manufacturing a semiconductor device involving a capacitor which enables a capacitor having a larger capacitance to be formed in a minute area with high reproducibility.

To attain the above-mentioned object, this invention provides the method of manufacturing a semiconductor device which comprises the steps of:

forming an insulation layer of the prescribed pattern having at least one opening in that region of the surface of a semiconductor substrate which constitutes a capacitor, said opening reaching the surface of said semiconductor substrate, thereby exposing said surface region;

selectively growing a semiconductor layer on that region of the surface of said semiconductor substrate which is exposed in said opening of the insulation layer; eliminating said insulation layer;

overlaying said semiconductor substrate and said semiconductor layer with a gate insulation film; and forming a capacitor electrode on said gate insulation film provided with stepped portions due to the elimination of said insulation layer.

A method embodying this invention for manufacturing a semiconductor device involving a capacitor offers the advantages that a capacitor is formed on the stepped region of the surface of a semiconductor substrate formed by selective growth, making it possible to provide a capacitor having a larger capacitance than a trench capacitor. The capacitance can be controlled by the stepped pattern provided in the capacitor-constituting substrate surface region and the depth of the depressions involved in said stepped pattern. The control of the capacitance, by varying the above-mentioned factors, can be more satisfactorily effected than by forming a deep fine trench in the substrate. Therefore, the capacitor can be formed with a high reproducibility of its capacitance. A MOS type dRAM whose integration is progressively advanced can be manufactured with higher efficiency.

BRIEF DESCRIPTION OF THE DRAWINGS

Other objects and advantages will be apparent from the following description taken in conjunction with the accompanying drawings in which:

FIGS. 5 through 11 are plan views of a semiconductor device manufactured by the methods representing the other embodiments of the invention.

DETAILED DESCRIPTION OF THE PREFERRED EMBODIMENTS

Description may now be made with reference to FIGS. 1A through 1E of a method of manufacturing a semiconductor device involving a MOS capacitor according to a first embodiment of this invention.

Figure 1A:
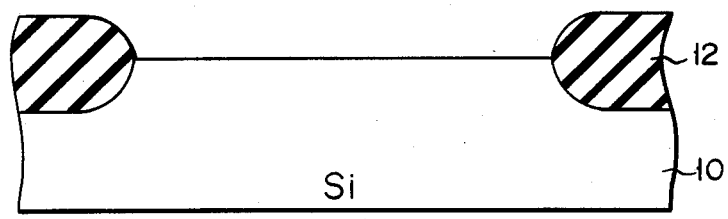
FIGS. 1A through 1E are sectional views illustrating the sequential steps of manufacturing a semiconductor device according to a first embodiment of this invention.
Figure 1B:
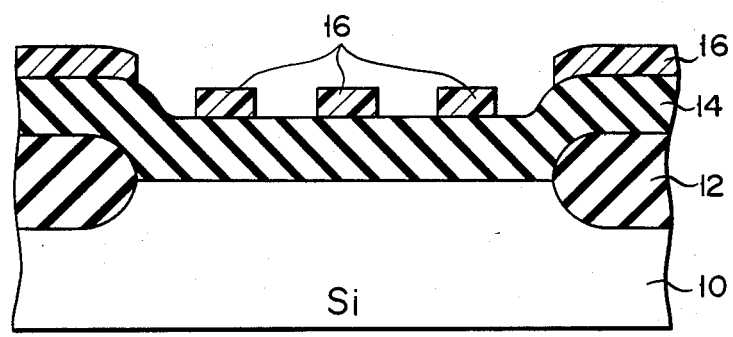
Figure 1C:
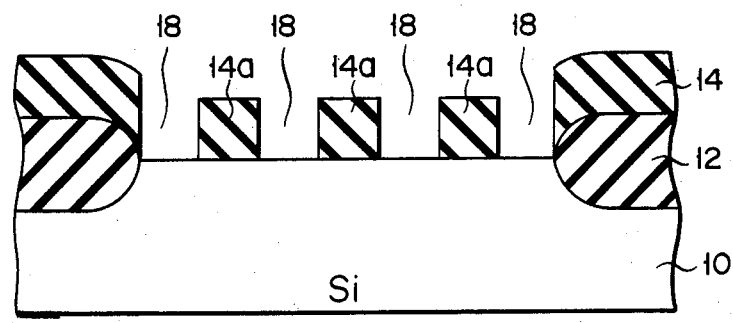
Figure 1D:
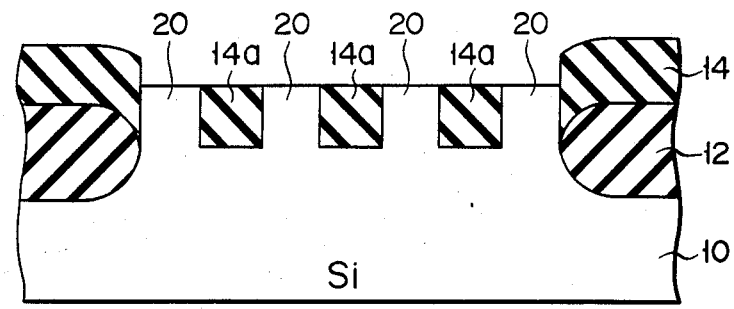
Figure 1E:
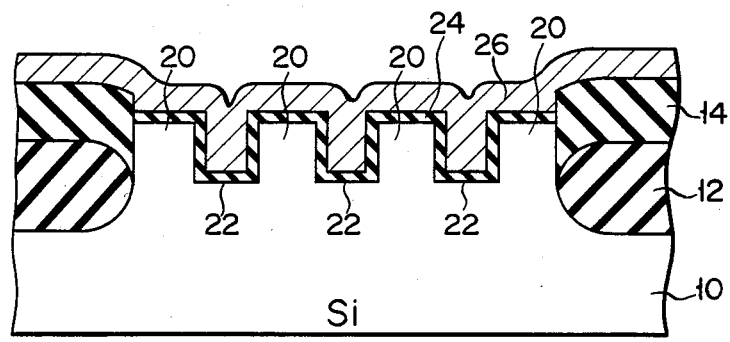

A field insulation film is formed on a silicon substrate 10 as shown in FIG. 1A and a CVD oxide film 14 of, for example, 1.5 μm is deposited on the whole surface of the resultant structure, followed by forming a photoresist layer of a predetermined pattern on the surface of the resultant structure by a known method as shown in FIG. 1B. The oxide film 14 is selectively etched with the photoresist layer 16 as a mask to form a plurality of openings 18 reaching the surface of the silicon substrate 10. This process leaves a pattern 14a of oxide films of a rectangular cross section on the surface of the silicon substrate. As shown in FIG. 1D, a silicon layer 20 is grown on the exposed surface of the silicon substrate, i.e., on the bottom surface of the opening 18 of the oxide film 14, by an epitaxial growth method using an $SiH_2Cl_2/HCl$ series mixture gas. At this time, the selective growth is carried out with the substrate temperature set at, for example, 950° C. Then, the oxide film 14 is removed from the resultant structure to leave a plurality of openings 22 and a gate oxide film 24 of 10 nm is formed by a thermal oxidation method on the surface of the resultant structure. Then, a MOS capacitor electrode 26 of a polycrystalline silicon film is formed on the surface of the gate oxide film 24.

Figure 2:
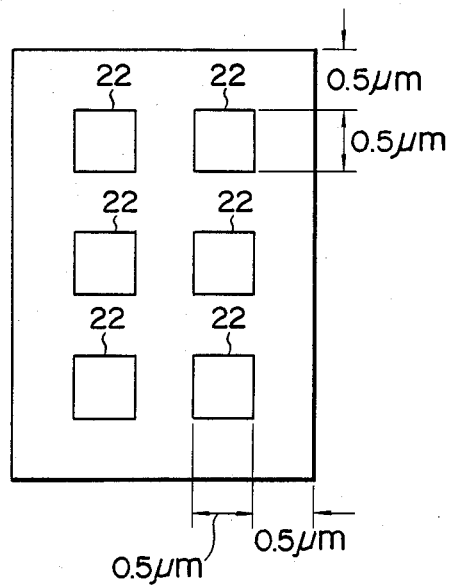
FIG. 2 is a plan view of FIG. 1E (a capacitor electrode omitted)

FIG. 2 is a plan view showing a MOS capacitor section embodying this invention, noting that the capacitor electrode 26 is omitted. The MOS capacitor section is 2.5×3.5 μm in dimension, in which six openings 22 of 0.5 μm are formed at intervals of 0.5 μm. With the depth of the opening or recess representing 1.0 μm, the capacitance of the MOS capacitor is found through a simple calculation to be about 83 fF. This capacitance is more than double that (about 35 fF) of a MOS capacitor so formed on a flat surface of 2.5 μm×3.5 as to have a similar 10 nm gate oxide film. The capacitance actually obtained was 81 fF with a dispersion of ±1.2%, in agreement with the above-mentioned calculated value.

According to the above-mentioned embodiment it is possible to form a MOS capacitor of a greater capacitance with a smaller occupation area. The formation of the plurality of such recesses permits a better control in the formation of elements in comparison with a method for gaining a capacitor area using one deeply etched trench. This arrangement, if applied to a MOS type dRAM, proves useful.

A method for the manufacture of a semiconductor device according to another embodiment of this invention will be explained below by referring to FIGS. 3A through 3E.

Figure 3A:
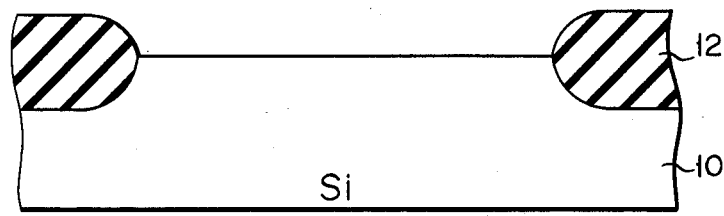
FIGS. 3A through 3E are sectional views indicating the sequential steps of manufacturing a semiconductor device according to a second embodiment of this invention.
Figure 3B:
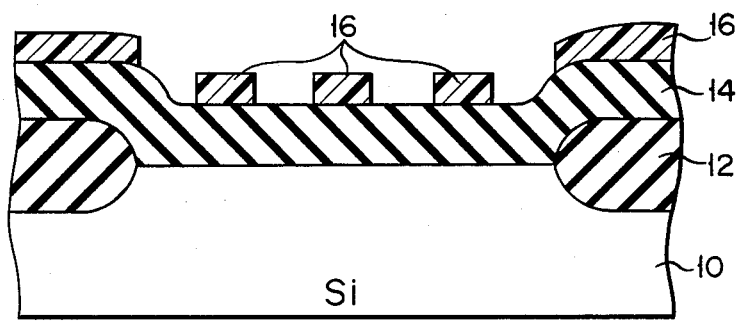
Figure 3C:
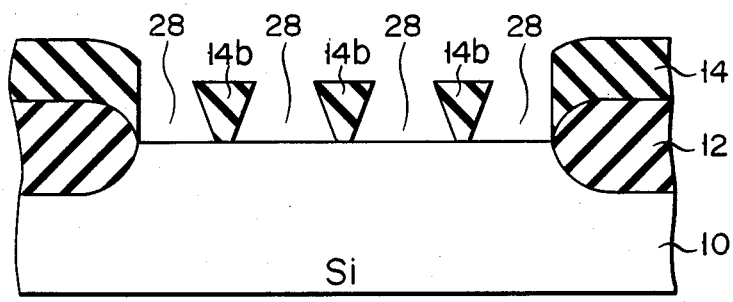
Figure 3D:
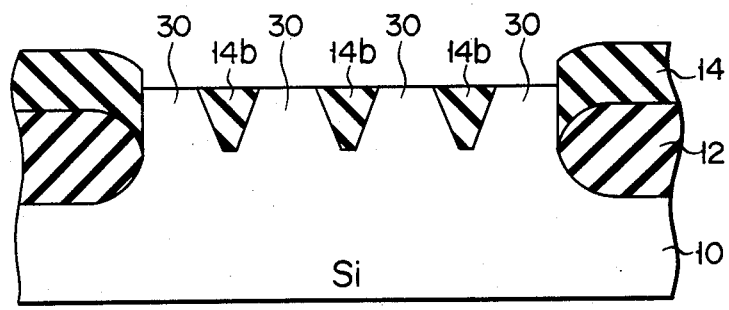
Figure 3E:
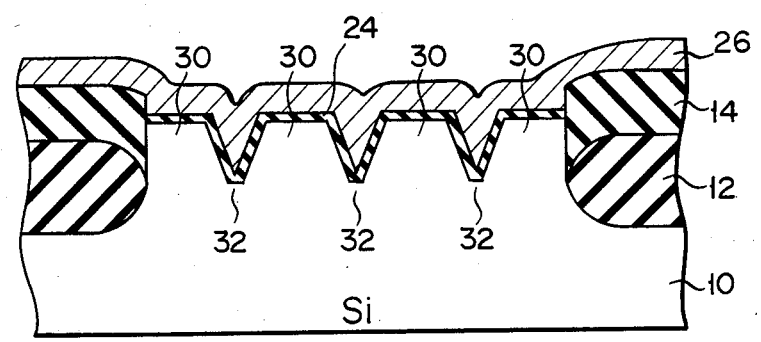

According to this embodiment of this invention a method is shown which manufactures a MOS capacitor having V-shaped recesses. Like the first-mentioned embodiment of this invention, a field insulation film 12 is formed on a silicon substrate 10 as shown in FIG. 3A and then a CVD oxide film 14 of, for example, 1.5 μm is deposited on the whole surface of the resultant structure as indicated in FIG. 3B, followed by forming a photoresist layer 16 of a predetermined pattern on the surface of the resultant structure by a known method. The oxide film 14 is selectively overetched with the photoresist layer 16 as a mask to form a plurality of recesses or openings 28 reaching the silicon substrate 10. This process leaves a pattern of oxide films 14b of a V-shaped cross section on the silicon substrate 10. The opening 28 is enlarged from an inlet thereof toward the surface of the semiconductor substrate 10 and is trapezoidal in cross section. In this case, the etching step is carried out using a 25 cc/min $C_2F_6$/10 cc/min $H_2$ series mixture gas under a pressure of 0.665 Pa ($5 \times 10^{-3}$ Torr) at a power of 150 W to permit ionization. As shown in FIG. 3D, a silicon layer 30 is selectively grown on the exposed surface of the silicon substrate 10, i.e., on the bottom surface of the opening 28 of the silicon oxide film 14b by an epitaxial growth method using an $SiH_2Cl_2$/HCl series mixture gas. At this time, the selective growth is carried out at a substrate temperature of, for example, 950° C. As shown in FIG. 3E, the oxide film 14b is removed, leaving a plurality of recesses 32 in the surface of the silicon substrate 10 and a gate oxide film 24 of 10 nm is formed by a thermal oxidation method on the surface of the resultant structure. Thereafter, a MOS capacitor electrode 26, which comprises a polycrystalline silicon film, is formed on the surface of the gate oxide film 24.

According to this embodiment, it is possible to obtain the same effect as in the first embodiment of this invention.

A third embodiment of this invention will be explained below by referring to FIGS. 4A through 4E.

Figure 4A:
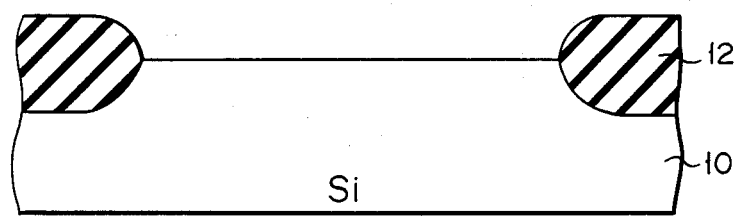
FIGS. 4A through 4E are sectional views showing the sequential steps of manufacturing a semiconductor device according to a third embodiment of this invention.
Figure 4B:
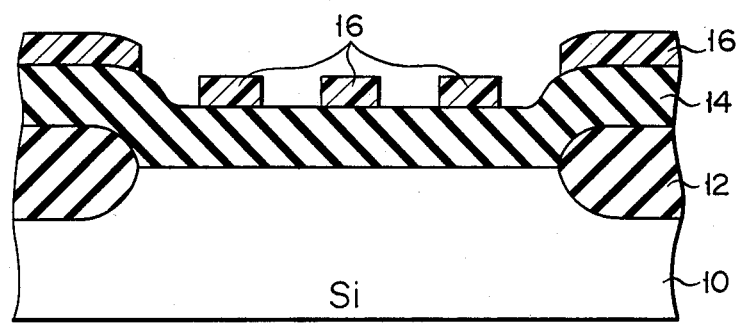
Figure 4C:
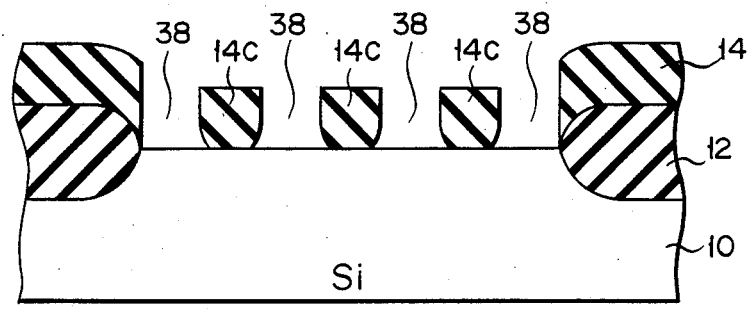
Figure 4D:
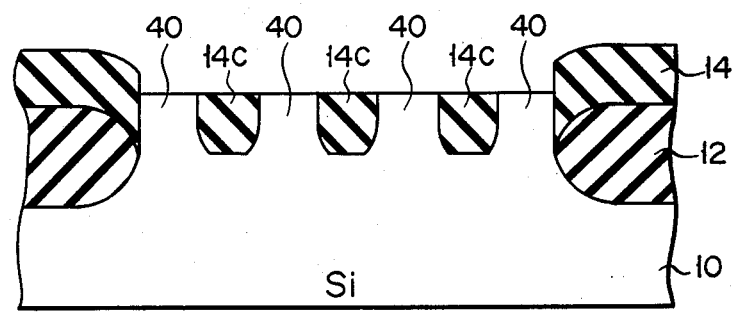
Figure 4E:
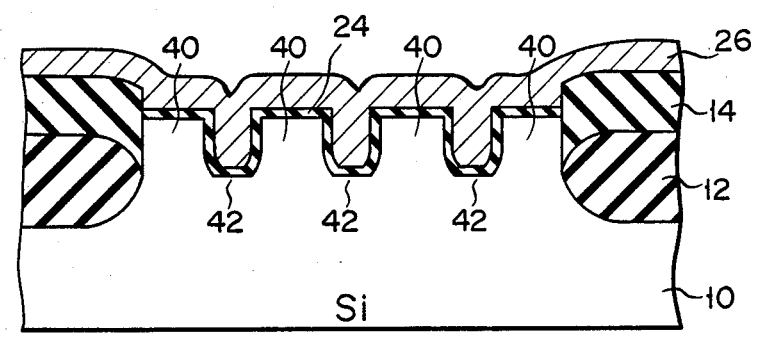
Figure 5:
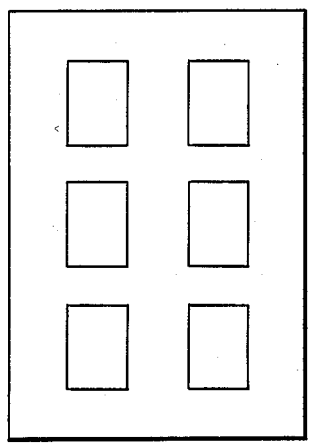
Figure 6:
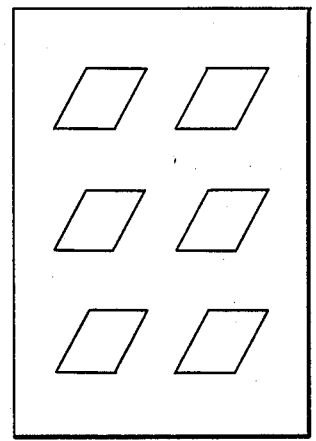
Figure 7:
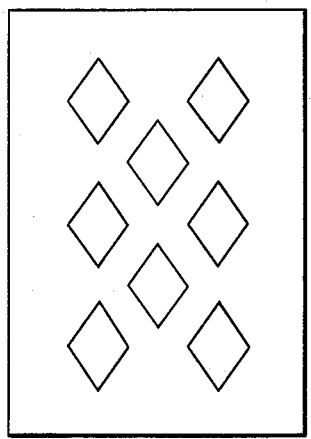
Figure 8:
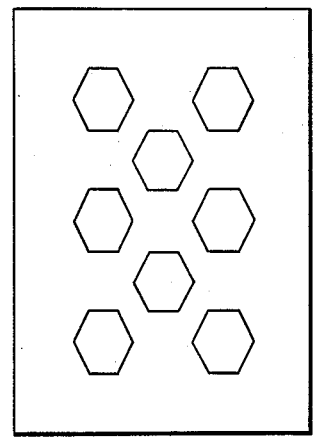

According to this embodiment, a method is shown which manufactures a MOS capacitor having U-shaped recesses. Like the first embodiment, as shown in FIG. 4A, a field insulating film 12 is formed on the silicon substrate 10 and a CVD oxide film 14 of, for example, 1.5 μm is deposited on the whole surface of the resultant structure as shown in FIG. 4B and a photoresist layer 16 of a predetermined pattern is formed by a known method on the surface of the resultant structure. As shown in FIG. 4C, the oxide film 14 is selectively overetched with the photoresist layer 16 as a mask to obtain a plurality of openings 38 reaching the silicon substrate 10. The opening 38 is enlarged from an inlet thereof toward the surface of the semiconductor substrate 10 and is flared in cross section. In this case, a pattern of oxide films 14c of a U-shaped cross section is left on the silicon substrate 10. In this connection it is to be noted that use is made, as an etching type, of a wet etching type using an $HF:H_2O$ (=1:20) solution. As shown in FIG. 4D, a silicon layer 40 is grown on the exposed surface of the silicon substrate 10, i.e., on the bottom surface of the opening 38 of the oxide film 14c, by an epitaxial growth method using an $SiH_2Cl_2$/HCl series mixture gas. At this time, the selective growth is carried out with the substrate temperature set at, for example, 950° C. Then, as shown in FIG. 4E, the oxide film 14 is removed to leave a plurality of recesses 42 and a gate oxide film 24 of 10 nm is formed by a thermal oxidation method on the surface of the resultant structure. Thereafter, a MOS capacitor electrode 26, which is comprised of a polycrystalline silicon film, is formed on the gate oxide film 24.

According to this embodiment, it is possible to obtain the same effect as in the first embodiment of this invention.

This invention is not restricted to the above-mentioned embodiments. For example, the recess formed by the selective growth may be not only a square in a plan view, but also a rectangle, parallelogram, diamond, hexagon, circle, ellipse or octagon, as seen in plan view in FIGS. 5 through 11, or any other shape or configuration. As the gate insulation film for the MOS capacitor, use may be made of not only the silicon oxide film, but also a silicon nitride film, alumina film, $Ta_2O_5$ film, $HfO_2$ film or $Nb_2O_5$ film so as to very effectively obtain a greater capacitance. Furthermore, a CVD or a direct nitride method can be utilized to form such gate insulation film. As the capacitor electrode material, use may be made of not only the polycrystalline silicon film, but also a metal having a high melting point, such as Mo, W, Ta, Ti or Hf or their silicides.

A variety of changes or modifications may be made without departing from the spirit and scope of this invention.

What is claimed is:

1. A method for manufacturing a semiconductor device having a capacitor, comprising the steps of:
   (a) forming an insulation film having at least one opening of a predetermined pattern on a capacitor formation area of a semiconductor substrate, said opening reaching the surface of the semiconductor substrate to expose the corresponding surface portion of the semiconductor substrate;
   (b) selectively burying a semiconductor layer in the bottom surface of at least one of said openings where the surface of the semiconductor substrate is exposed;

(c) removing said insulation film to form a recessed region on the surface of the semiconductor substrate; and (d) forming a capacitor electrode on the capacitor formation area of the semiconductor substrate with a gate insulation film therebetween.

2. The method according to claim 1, wherein said step (a) of forming an insulation film includes:

forming said insulation film on said capacitor formation area on said semiconductor substrate;

forming a mask of a predetermined pattern on said insulation film; and etching said insulation film through the use of the mask to form an opening in said insulation film, said opening having a vertical wall.

3. The method according to claim 1, wherein said step (a) of forming an insulation film includes:

forming said insulation film on said capacitor formation area on said semiconductor substrate;

forming a mask of a predetermined pattern on said insulation film; and overetching said insulation film through the use of said mask to form an opening there, said opening being enlarged from an inlet thereof toward the surface of said semiconductor substrate.

4. The method according to claim 1, wherein said step (a) of forming an insulation film includes:

forming said insulation film on said capacitor formation area on said semiconductor substrate;

forming a mask of a predetermined pattern on said insulation film; and overetching said insulation film through the use of said mask to form an opening in said insulation film, said opening being trapezoidal in cross section.

5. The method according to claim 1, wherein said step (a) of forming an insulation film includes:

forming said insulation film on said capacitor formation area on said semiconductor substrate;

forming a mask of a predetermined pattern on said insulation film; and overetching said insulation film through the use of said mask to form an opening in said insulation film, said opening being flared in cross section.

6. The method according to claim 1, wherein an inlet of said opening is square in configuration.

7. The method according to claim 1, wherein an inlet of said opening is rectangular in configuration.

8. The method according to claim 1, wherein an inlet of said opening is diamond shaped in configuration.

9. The method according to claim 1, wherein an inlet of said opening is a parallelogram in a plan view.

10. The method according to claim 1, wherein an inlet of said opening is hexagonal in configuration.

11. The method according to claim 1, wherein an inlet of said opening is octagonal in configuration.

12. The method according to claim 1, wherein an inlet of said opening is circular in configuration.

13. The method according to claim 1, wherein an inlet of said opening is elliptical in configuration.

* * * * *